(12) United States Patent
Yonezawa et al.

(10) Patent No.: US 7,594,479 B2
(45) Date of Patent: Sep. 29, 2009

(54) PLASMA CVD DEVICE AND DISCHARGE ELECTRODE

(75) Inventors: Masato Yonezawa, Kanagawa (JP); Naoto Kusumoto, Kanagawa (JP); Hisato Shinohara, Yamanashi (JP)

(73) Assignees: Semiconductor Energy Laboratory Co., Ltd., Atsugi-shi, Kanagawa-ken (JP); TDK Corporation, Tokyo (JP)

(*) Notice: Subject to any disclaimer, the term of this patent is extended or adjusted under 35 U.S.C. 154(b) by 0 days.

(21) Appl. No.: 09/820,520

(22) Filed: Mar. 28, 2001

(65) Prior Publication Data

US 2001/0050057 A1  Dec. 13, 2001

(30) Foreign Application Priority Data

Mar. 29, 2000  (JP)  ............................. 2000-092547

(51) Int. Cl.
 *H01L 21/306* (2006.01)
 *C23C 16/00* (2006.01)
(52) U.S. Cl. .................... 118/723 E; 118/715; 118/718; 118/729; 156/345.33; 156/345.47; 156/345.54
(58) Field of Classification Search ................. 118/715, 118/723 E, 723 R, 718, 729; 156/345.29, 156/345.33, 345.34, 345.43, 345.44, 345.45, 156/345.46, 345.47, 345.54
See application file for complete search history.

(56) References Cited

U.S. PATENT DOCUMENTS

| | | | |
|---|---|---|---|
| 4,400,409 A | 8/1983 | Izu et al. | |
| 4,410,558 A | 10/1983 | Izu et al. | |
| 4,479,455 A | 10/1984 | Doehler et al. | |
| 4,519,339 A | 5/1985 | Izu et al. | |
| 4,520,757 A | 6/1985 | Nath et al. | |
| 4,545,236 A | 10/1985 | Turczyn | |

(Continued)

FOREIGN PATENT DOCUMENTS

JP  52-122581  7/1982

(Continued)

OTHER PUBLICATIONS

Japanese Form for Production of Publications (Japanese Application No. 2000-092547), with full translation, mailed Dec. 4, 2007, 4 pages.

(Continued)

*Primary Examiner*—Luz L. Alejandro
(74) *Attorney, Agent, or Firm*—Fish & Richardson P.C.

(57) ABSTRACT

In a film formation chamber, a gas flow to be introduced is rectified in a direction away from the film formation surface of the substrate on which the film is to be formed, so as to exhaust the fine particles generated in the discharge space and the fragmental particles generated by exfoliation of the film from the wall of the vacuum chamber and the discharge electrode, thereby preventing the particles from adhering the film formation surface of the substrate. The fine particles and fragmental particles are sucked and exhausted from a plurality of apertures provided on the entire surface of the discharge electrode to establish a steady state in which the amount of a film deposited on the discharge electrode and the amount of an exfoliating film to be exhausted are equal to each other, thereby allowing continuous film formation without cleaning the discharge electrode over a long period.

30 Claims, 8 Drawing Sheets

U.S. PATENT DOCUMENTS

| | | | | |
|---|---|---|---|---|
| 4,808,553 | A | * | 2/1989 | Yamazaki .................. 438/485 |
| 5,614,026 | A | * | 3/1997 | Williams ............. 118/723 ER |
| 5,900,103 | A | * | 5/1999 | Tomoyasu et al. ....... 118/723 E |
| 6,156,151 | A | * | 12/2000 | Komino et al. ......... 156/345.29 |

FOREIGN PATENT DOCUMENTS

| | | |
|---|---|---|
| JP | 58-216475 | 12/1983 |
| JP | 59-034668 | 2/1984 |
| JP | 62-043554 | 2/1987 |
| JP | 05-144595 | 6/1993 |
| JP | 09-129555 | 5/1997 |

OTHER PUBLICATIONS

Japanese Document attached to Form for Production of Publication (Japanese Application No. 2000-092547; J04820), with full translation, mailed Dec. 4, 2007, 6 pages.

* cited by examiner

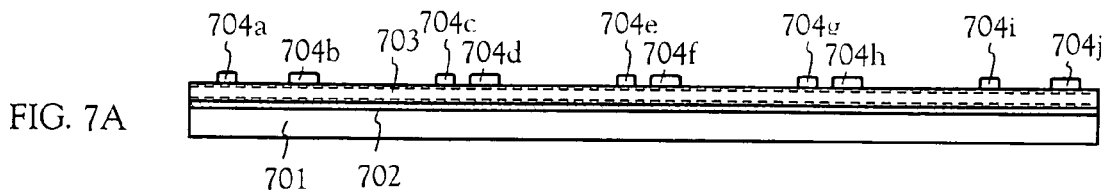
FIG. 7A
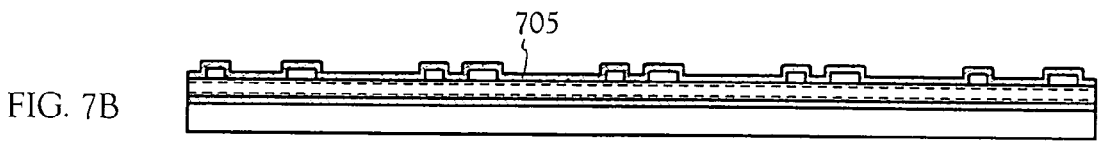
FIG. 7B
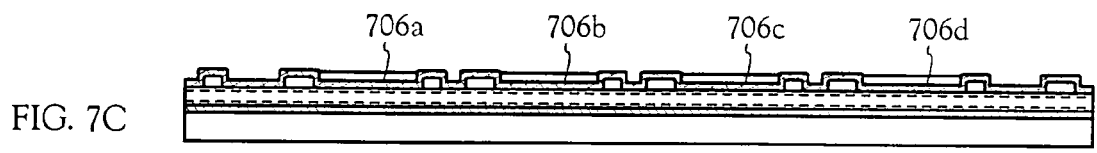
FIG. 7C
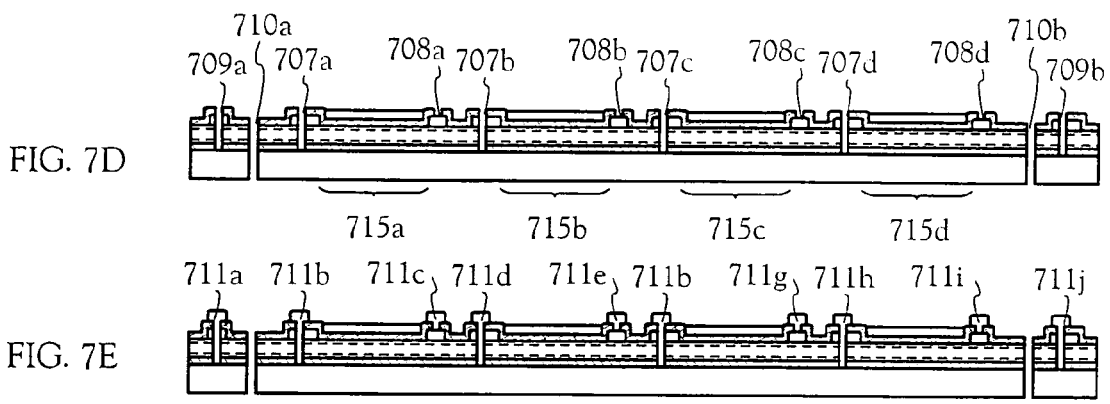
FIG. 7D
FIG. 7E
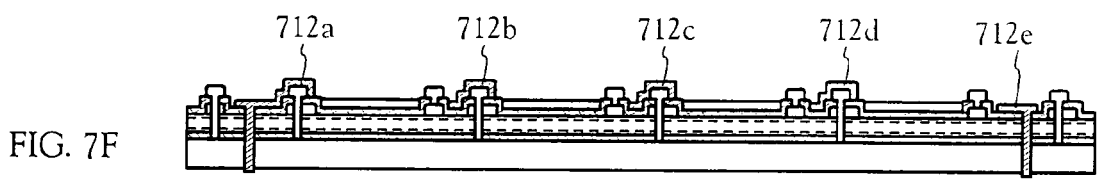
FIG. 7F
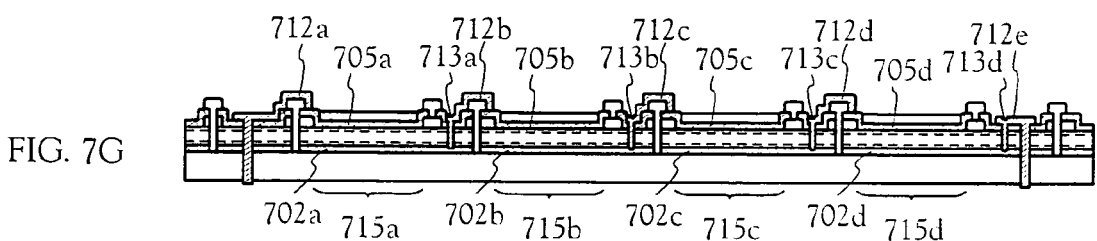
FIG. 7G
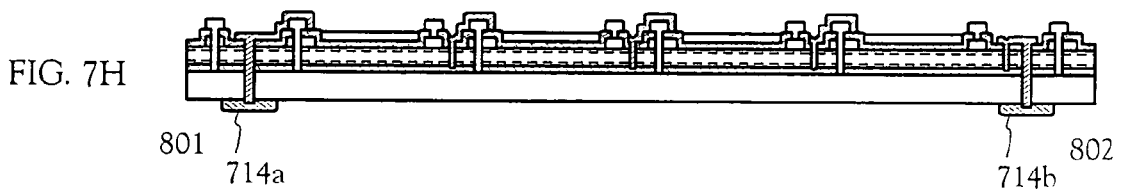
FIG. 7H

PLASMA CVD DEVICE AND DISCHARGE ELECTRODE

BACKGROUND OF THE INVENTION

1. Field of the Invention

The present invention relates to a plasma CVD device and a discharge electrode.

2. Description of the Related Art

Recently, in view of mass production of electronic devices such as a thin film solar battery, a low-cost manufacturing process has been expected to be developed. Above all, in a semiconductor layer formation process, efforts have been made to increase a utilization efficiency of a film formation gas, to use a high-frequency power source for causing discharge to perform high-speed film formation, and the like. As compared with a hard substrate such as a glass substrate, a soft substrate such as a thin resin film has enough flexibility to be rolled up. As one means of reducing the manufacture cost using such a flexible substrate, a method of continuously conducting unit operations such as film formation, printing and laser processing in an inline manner while rewinding a rolled-up flexible substrate around another roll is known. This method is referred to as a Roll-to-Roll method.

As a method of particularly enhancing the productivity of a thin film formation process, it is effective to perform continuous conveyance and film formation using a film formation apparatus equipped with a conveyor employing a Roll-to-Roll method as described in, for example, Japanese Patent Application Laid-Open Nos. Sho 58-216475 and 59-34668. In the film formation apparatus equipped with a conveyor employing a Roll-to-Roll method, continuous film formation is performed while continuously conveying a flexible film substrate. In order to efficiently obtain a desired thickness, there are methods such as extending the length of a discharge electrode for film formation, increasing the carrying speed, and continuously forming a long shaped film.

In the case where a non-single crystalline silicon film is to be formed by a plasma CVD method, a silane gas $SiH_4$ is decomposed in a discharge space to reach a surface of the non-single crystalline silicon film on a substrate so as to be bonded therewith. As a result, a film is formed. In this film formation process, the silane gas in the discharge space after decomposition causes cohesion among monomolecules even before reaching the surface of the non-single crystalline silicon film on the substrate. As a result, there are cohered particles diversely called according to their sizes, such as a material gas of monomolecules, a monomer, a cluster in which a plurality of molecules are cohered to each other, a nuclear, and a ultrafine particle. The cohered particles generated in a discharge space are called herein fine particles. On the other hand, a non-single crystalline silicon film is formed on a discharge electrode and on a wall of a vacuum chamber in addition to the substrate on which a film is to be formed. Thereafter, the non-single crystalline silicon film exfoliates due to the difference in adherence or in stress with the wall or the electrode, resulting in fragmental particles. The particles generated due to exfoliation of the film after its formation on the wall or the electrode are herein referred to as fragmental particles.

In the case where electronic devices such as a solar battery are to be formed, if fine particles or fragmental particles having a diameter larger than a desired thickness of the non-single crystalline silicon film adhere onto a substrate on which a film is to be formed, the characteristics of the solar battery and a yield of non-defective products are lowered. FIGS. 1A through 1C are cross-sectional views showing the process of forming a solar battery, with which the reason of a lowered yield will be described. First, a lower electrode layer 102 is formed on a substrate 101 on which a film is to be formed, and a non-single crystalline silicon layer is formed thereon. During the formation of the non-single crystalline silicon layer, fine particles 104 and fragmental particles 105 described above adhere onto the lower electrode 102 to be introduced into the non-single crystalline silicon layer. The sizes of the fine particles 104 and the fragmental particles 105 are varied; the fine particles 104 or the fragmental particles 105 that are larger than a thickness of the non-single crystalline silicon layer are also present. The fine particles 104 or the fragmental particles 105 may fall off after the formation of the non-single crystalline silicon layer. FIG. 1B shows holes 106 formed after the fine particles 104 or the fragmental particles 105 fell from the non-single crystalline silicon layer. Thereafter, an upper electrode layer 107 is formed. In the hole regions formed after the fine particles 104 and the fragmental particles 105 fell off, regions 108 where the upper electrode and the lower electrode contact each other are formed. Since the contact regions 108 are extremely small and have high resistance, a leak current in these regions 108 is extremely small. In the case where the solar battery is under solar light of AM 1.5, a leak current hardly affects the output characteristics of the solar battery. In the case where the solar battery is under light having low illuminance such as light from a fluorescent lamp, however, a leak current affects the output characteristics of the solar battery to lower the characteristics and a yield of the solar battery.

FIGS. 2A and 2B show a discharge electrode having a conventional structure for a plasma CVD device. Discharge is caused between a ground electrode 202 and a high-frequency electric power side electrode 203 to form a film on a substrate 201 on which a film is to be formed (hereinafter, referred to simply as substrate 201). A material gas 206 passes through the high-frequency electric power side electrode 203 to jet out from small holes formed on an electrode substrate 294, resulting in a gas flow 207 flowing in the direction of the substrate 201. Since the electrode substrate 204 is a metallic plate having a plurality of small holes formed therethrough, the electrode substrate 204 is also referred to as a shower plate. A discharge electrode having the gas introducing structure as described above is herein referred to as a shower plate type discharge electrode. In a shower plate type discharge electrode, fine particles 211 grown in a discharge space 205 and fragmental particles 210 exfoliating from the electrode plate 204 are subjected to viscous resistance from the gas flow 207 flowing in the direction of the substrate to flow in a direction along the substrate 201. As a result, the fine particles 211 and the fragmental particles 210 adhere onto the substrate 201.

If a film is formed at high speed using a plasma CVD method or the like, the probability of generation of fine particles grown from a material gas becomes high in a sheath region in a discharge space. Moreover, if continuous film formation is performed over a long period of time, a film deposited on a discharge electrode exfoliates as fragmental particles to adhere onto the substrate. A thickness of the film deposited on the discharge electrode increases with elapse of film formation time, whereby the probability that fragmental particles adhere onto the substrate becomes higher.

As one of the methods of preventing fragmental particles that exfoliate from the discharge electrode from adhering onto a substrate on which a film is to be formed, a film on the surface of the electrode is removed by etching before the film exfoliates in the state where the film is deposited to some degree on the surface of the electrode. In practice, however, when a film is formed by using a Roll-to-Roll method, for example, etching should be frequently conducted before the film is continuously formed over a sufficient length. Therefore, in order to continuously form a film, the film formation process must be often interrupted. The employment of a method of frequently conducting etching to prevent fragmental particles from adhering results in a poor production efficiency. Although a method of heating an electrode plate or the like may be used to restrain the occurrence of exfoliation of the film from the discharge electrode, there is still a need of conducting etching before exfoliation of the film. Accordingly, it is not possible to continuously form a film over a sufficiently long period of time.

In order to remove fine particles present in a discharge space, there is a method of causing a material gas flow in a direction parallel to a substrate on which a film is to be formed, as disclosed in Japanese Examined Patent Application Laid-Open No. Sho 62-43554. FIG. 3 shows a material gas flow in the case where a material gas is flowed in a direction parallel to a substrate on which a film is to be formed. In this method, a gas flow parallel to a substrate 301 on which a film is to be formed (hereinafter, referred to simply as substrate 301) gradually contains a flow 306 toward the substrate 301 due to turbulence of the gas flow while moving over a long distance between the substrate 301 and a discharge electrode 303. Fine particles generated in a discharge space 304 or fragmental particles generated by exfoliation of the film deposited on the discharge electrode 303 move along the gas flow. A part of the particles flow in the direction of the substrate 301 due to turbulence or diffusion of the gas flow to adhere onto the substrate 301. Moreover, as disclosed in Japanese Patent Application Laid-Open No. Hei 5-144595, there is also a method of introducing a gas flow from one direction of an enclosed space containing a discharge electrode and exhausting the gas flow from another direction. Also in this method, since fragmental particles and fine particles move along the gas flow over a long distance between a substrate and a film formation surface opposing thereto, a part of the particles flow in the direction of the substrate on which a film is to be formed due to turbulence or diffusion of the gas flow to adhere thereto.

A pulse plasma method is for interrupting discharge once before reactive monomolecules generated by decomposition in a discharge space cohere to each other and grow to have the size of fine particles, so that relatively small fine particles can be exhausted along the flow of a material gas. The electric power from a power source for discharge is pulsed because an ON state and an OFF state are alternatively repeated in a short period of time. In the pulse plasma method, however, when it is attempted to exhaust fine particles having the size that does not lower the characteristics of a solar battery or the like, a period of discharge time becomes extremely short and a time period in which discharge is interrupted becomes relatively long. As a result, a utilization efficiency of a material gas is lowered. In addition, since a gas flow is present even in the period where discharge is interrupted, fragmental particles adhere onto the substrate on which a film is to be formed.

SUMMARY OF THE INVENTION

In view of the above problems, the present invention has an object of preventing particles such as fine particles generated by cohesion in a discharge space and fragmental particles generated by exfoliation of a film after the film is formed on a wall of a vacuum chamber or a discharge electrode, from adhering onto a substrate on which the film is to be formed, thereby continuously providing electronic devices such as a solar battery having excellent characteristics and yield. Moreover, the present invention eliminates the need of cleaning the discharge electrode even when the discharge is continuously performed over a long period of time to improve the productivity in a plasma CVD device.

In a film formation chamber, a gas flow to be introduced is rectified in a direction away from a film formation surface of the substrate on which the film is to be formed, so that fine particles generated in a discharge space and fragmental particles generated by exfoliation of the film from the wall of the vacuum chamber or the discharge electrode are exhausted along with the gas flow, thereby preventing the particles from adhering onto the film formation surface of the substrate on which the film is to be formed. The fine particles or the fragmental particles are sucked from a plurality of apertures provided on the entire surface of the discharge electrode to be exhausted so as to establish a steady state in which the amount of a film deposited onto the discharge electrode is equal to that of an exfoliating film to be exhausted. As a result, continuous film formation is made possible without cleaning the discharge electrode over a long period of time.

BRIEF DESCRIPTION OF THE DRAWINGS

FIGS. 7A to 7H are cross-sectional views showing a solar battery manufactured according to product specifications of Embodiment 2.

DESCRIPTION OF THE PREFERRED EMBODIMENTS

Figure 1A:
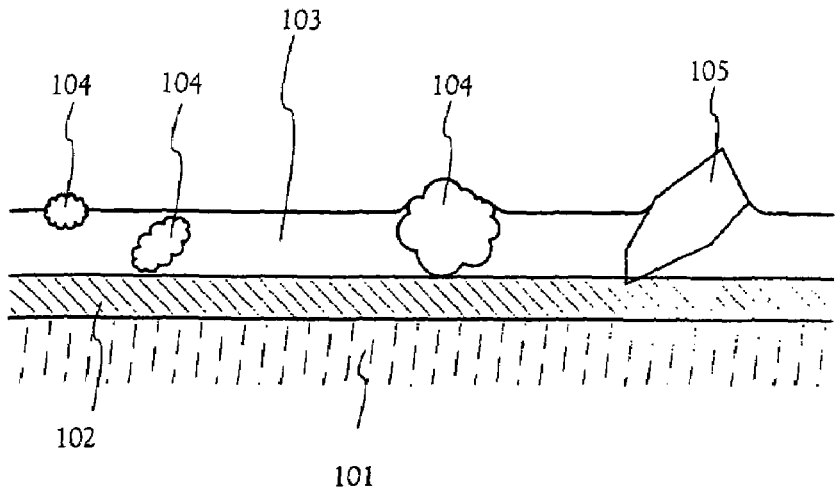
FIGS. 1A to 1C are cross-sectional views showing the occurrence of poor characteristics in a formation process of a solar battery of the prior art.
Figure 1B:
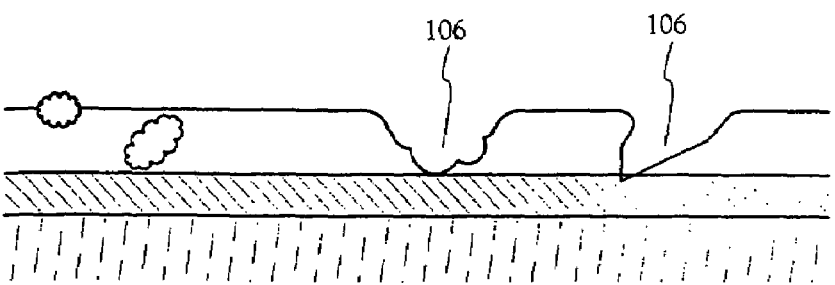
Figure 1C:
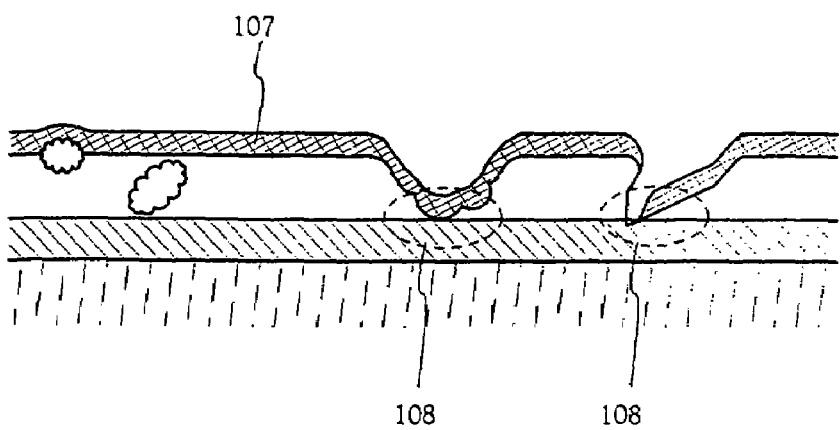
Figure 2A:
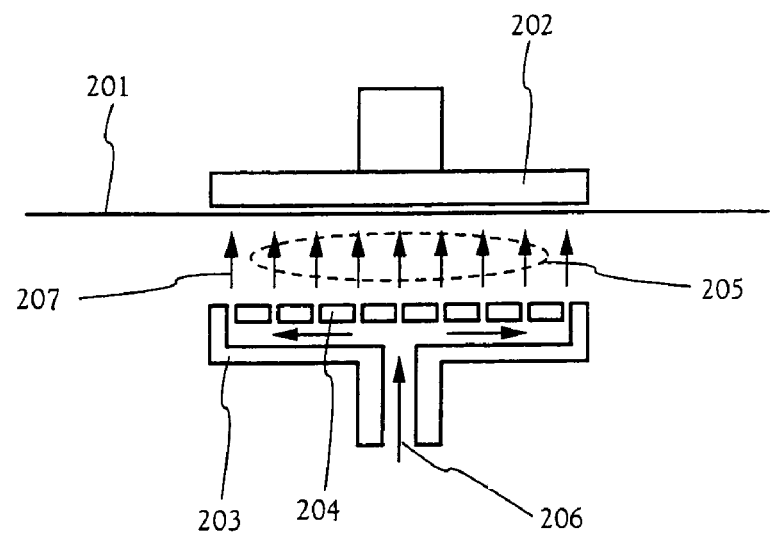
FIGS. 2A and 2B are cross-sectional views showing a conventional shower plate type discharge electrode for a plasma CVD device.
Figure 2B:
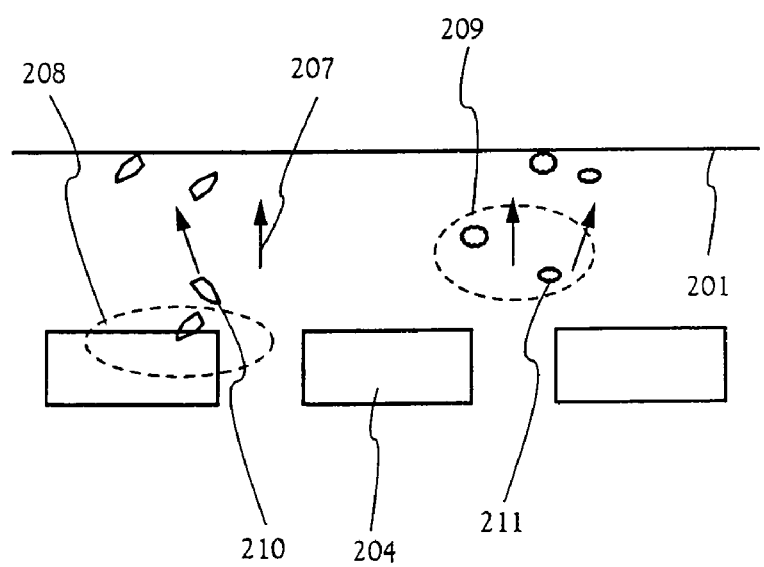
Figure 3:
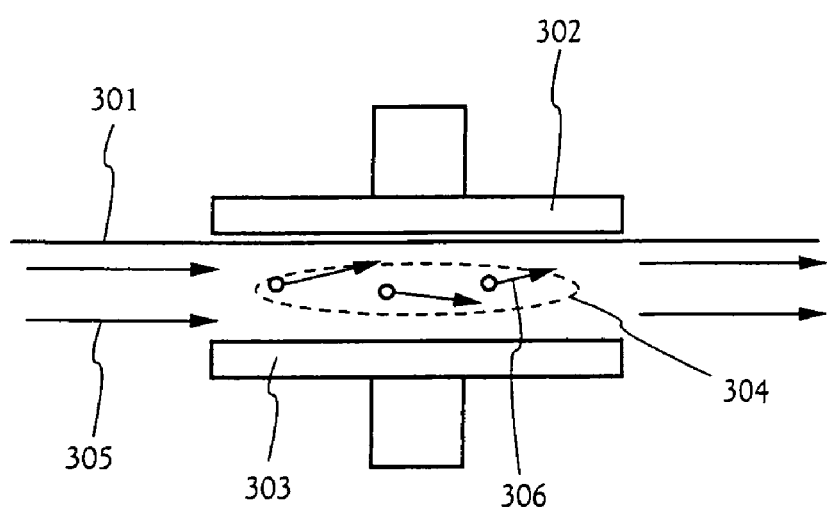
FIG. 3 is a cross-sectional view showing a conventional discharge electrode for a plasma CVD device employing a method of causing a gas flow in a direction parallel to a substrate.
Figure 4A:
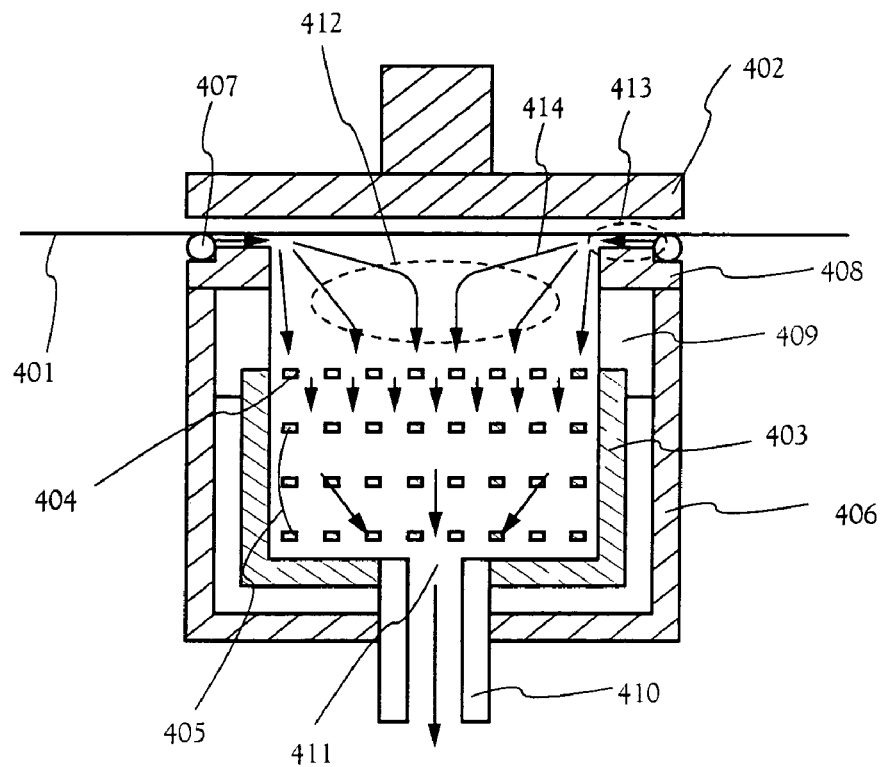
FIGS. 4A and 4B show a discharge electrode for a plasma CVD device employing a method of causing a gas flow in a direction going away from a film formation surface and sucking the gas by an electrode of the present invention.

Hereinafter, a structure of the present invention will be described with reference to the drawings. First, a discharge electrode having a structure as shown in FIG. 4A is prepared. As a material of the discharge electrode, an aluminum alloy is used in view of electrical conductivity and its use in a vacuum chamber. An introduction gas is introduced from a gas introduction tube 407 in the vicinity of a surface of a substrate 401 on which a film is to be formed (hereinafter, referred to simply as substrate 401). The introduced gas passes through a discharge space 412 to reach a surface of an electrode plate 404 having a plurality of apertures. Then, the introduced gas passes an abnormal discharge preventing plate 405 having a plurality of apertures to be exhausted from an exhaust port 411. The electrode plate 404 may be a metallic plate having a plurality of apertures or a metallic mesh plate. In other words, a metallic plate has apertures as large as possible for exhausting the gas therethrough.

Figure 4B:
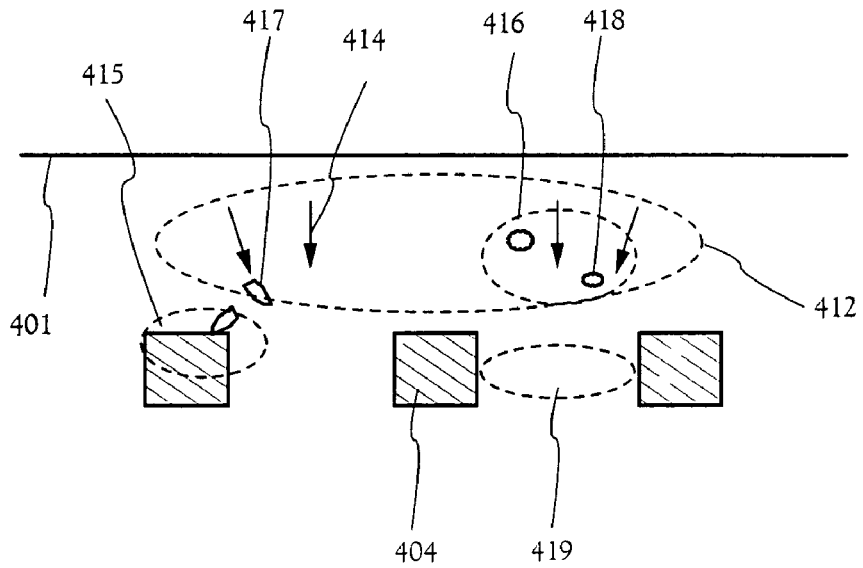

FIG. 4B shows the details of the vicinity of the discharge space 412. Since the introduced gas flows from the substrate 401 through the discharge space 412 toward the electrode plate 404, fine particles generated in the vicinity of a region 416 in the discharge space are exhausted from an aperture 419 of the electrode plate 404. Fragmental particles generated by exfoliation of a film formed on the electrode plate 404 are exhausted by the gas flow toward the aperture 419 and therefore do not reach the surface of the substrate 401, although there is still a possibility that the fragmental particles are temporarily stirred up due to turbulence of the gas flow. Therefore, the fine particles and the fragmental particles are prevented from adhering onto the film formation surface of the substrate 401.

In a film deposited onto the electrode plate 404, by establishing a steady state in which the amount of a film to be deposited and the amount of an exfoliating film to be exhausted are equal to each other, the amount of the deposited film does not exceed a certain amount. Although the film formation is interrupted to perform etching in the prior art because the deposited film cannot be removed during film formation, it is possible to continuously form a film without cleaning the discharge electrode over a long period of time in the technique of the present invention.

In the strict observation, inertial force, gravity, Brownian diffusion, electrostatic force and the like are exerted on the particles. Among the above forces exerted on the particles, inertial force and gravity are more likely to act on the particles as a diameter of the particle increases. On the other hand, Brownian diffusion and electrostatic force are more likely to act on the particles as a diameter of the particle decreases. In other words, the particles are most susceptible to inertial force and gravity to be moved as their diameter increases, and the particles are more susceptible to Brownian diffusion and electrostatic force to be moved as their diameter decreases. Fine particles and fragmental particles that lower the characteristics and yield in electronic devices such as a solar battery have a diameter equal to or larger than a thickness of the film. In the fine particles and fragmental particles having such size, the movement induced by influence of inertial force and gravity becomes dominant.

The present invention targets on fine particles and fragmental particles having a diameter larger than a film thickness of electronic devices of interest such as a solar battery, which are introduced into the film to affect the characteristics. The fine particles and fragmental particles move due to inertial force and gravity caused by a gas flow and are prevented from adhering onto a film formation surface of a substrate by rectifying the gas flow in a direction going away from the film formation surface of the substrate and by downwardly placing the film formation surface of the substrate so that the fine particles and fragmental particles are not deposited onto the film formation surface due to gravity. In the present invention, relatively small particles, in which the effects of Brownian diffusion and electrostatic force are more dominant than those of inertial force and gravity, such as monomers having a similar size to that of molecules of a material gas and clusters formed by cohesion of several molecules, reach and are deposited onto the substrate on which a film is to be formed, a wall of a film formation chamber and a surface of a discharge electrode due to diffusion of particles, So that a film is formed on the substrate, the wall of a film formation chamber and the surface of a discharge electrode.

Embodiment 1

Figure 5:
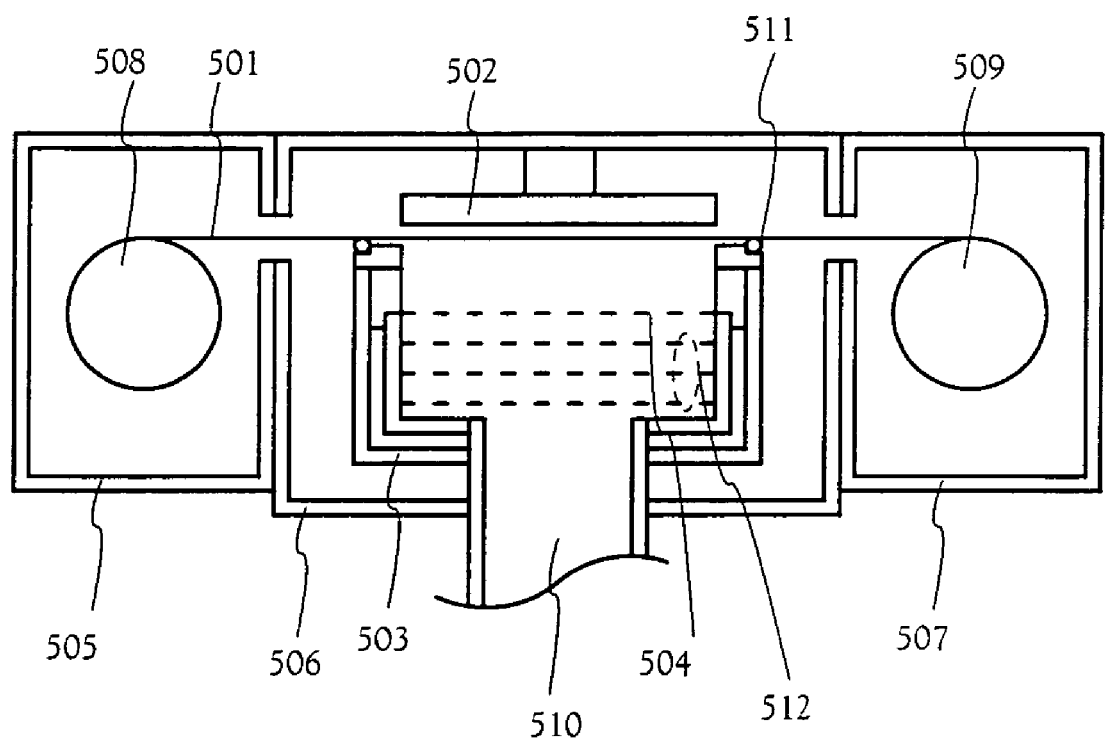
FIG. 5 shows a plasma CVD device employing a method of causing a gas flow in a direction going away from the film formation surface and sucking the gas by an electrode of Embodiment 1.

In this embodiment, a non-single crystalline silicon solar battery having a PIN structure is manufactured so as to examine its output characteristics due to effects of fine particles and fragmental particles. First, a plasma CVD dice as shown in FIG. 5 is prepared. The plasma CVD device includes a flexible substrate conveyor consisting of an unwinding roll 508 and a winding roll 509, a vacuum chamber 505 for unwinding, a vacuum chamber 506 for film formation, a vacuum chamber 507 for winding, a film formation gas introducing system, a gas exhaust port 510, and a high-frequency power source introducing system. The high-frequency power source introducing system includes a ground electrode 502 also serving as a heater for heating a substrate, a ground electrode 503 serving to block plasma from the periphery of the electrode, and a high-frequency side gas sucking electrode 504 opposing thereto.

As the high frequency power source side electrode plate 504, a punched metal made of an aluminum alloy having apertures $\Phi$ of 2 to 8 mm and an interval between the apertures of 3 to 8 mm, or a metallic mesh of Nos. 10 to 20 is used. A pipe made of an aluminum alloy having an inner diameter $\Phi$ of 4 mm is used as a gas introducing tube 511. On the side face of the pipe, holes having a diameter $\Phi$ of 1 mm are formed at intervals of 2 cm. These holes are used as material gas introducing ports. An abnormal discharge preventing plate 512 is provided between the high frequency power source side electrode plate 504 and the gas exhaust port 510. As the abnormal discharge preventing plate 512, a metallic mesh of Nos. 10 to 20 is used.

A flexible substrate 501 is placed so as to be unwound from the unwinding roll 508, to pass between the ground electrode 502 and the gas sucking electrode 504 opposing thereto, and to be wound around the winding roll 508. At this time, a predetermined torque in a direction opposite to a conveying direction viewed from the winding roll 509 is applied to the unwinding roll 508 so as to apply tension to the flexible substrate 501. In this embodiment, a PEN (polyethylene naphthalate) film is used as the flexible substrate 501. A lower electrode is formed on the flexible substrate 501. The lower electrode has, for example, a double-layered structure of aluminum and SUS (stainless steel).

Next, the pressure in all vacuum chambers is reduced, and a temperature of the heater for heating the substrate 501 is increased so that a film formation surface of the flexible substrate 501 reaches a desired temperature. The temperature is set to be 100° C. when an N-layer and a P-layer are to be formed, and is set to be 200° C. when an I-layer is to be formed. A material gas for film formation is introduced so as to adjust the pressure. A mixed gas of silane, phosphine and hydrogen is introduced for formation of the N-layer, a mixed gas of silane and hydrogen is introduced for formation of the I-layer, and a mixed gas of silane, diborane and hydrogen is introduced for formation of the P-layer. The pressure is adjusted to be 53 to 266 Pa. Phosphine or diborane is mixed at 0.2 to 2% with respect to silane.

After adjustment of the pressure, a high-frequency electric power is applied to the electrode to generate a plasma so as to form a non-single crystalline silicon film. A high frequency electric power to be applied for formation of the film is 0.06 to 0.8 W/cm$^2$. The flexible substrate 501 is conveyed while being wound around the winding roll 509 so as to form a film.

A thickness of the N-layer and the P-layer is 0.01 to 0.05 μm, and a thickness of the I-layer is 0.3 to 0.8 μm.

Figure 6A:
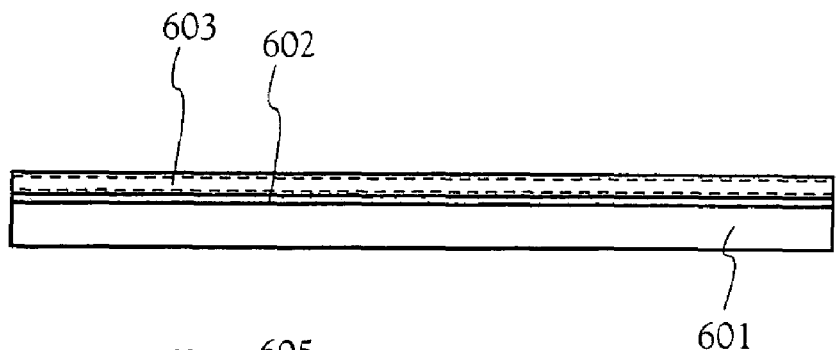
FIGS. 6A to 6D show a solar battery for characteristic measurement of Embodiment 1.
Figure 6B:
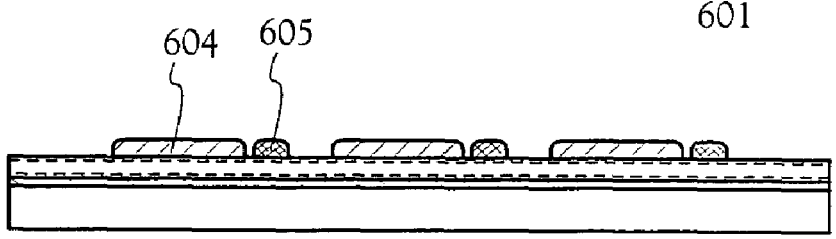
Figure 6C:
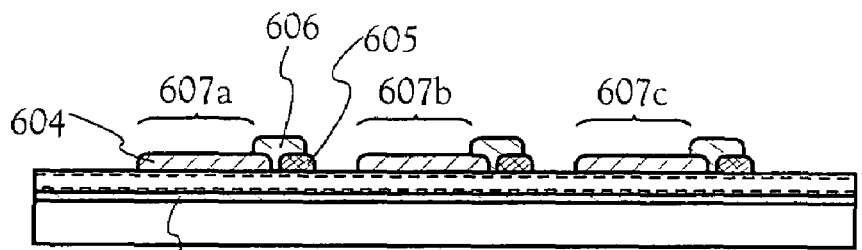
Figure 6D:
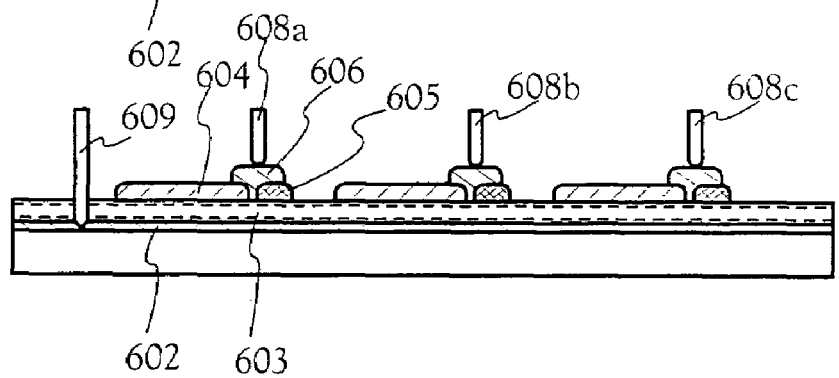

After formation of the film, an upper electrode is formed on the non-single crystalline silicon film to complete a solar battery of 1 cm². A method of forming a solar battery is shown in FIGS. 6A to 6D. First, after formation of the film, a lower electrode 602 and a non-single crystalline silicon layer 603 are formed on a long-shaped flexible substrate 601, as shown in FIG. 6A. Next as shown in FIG. 6B, an upper electrode 604 is formed in an island shape, and an insulating layer 605 is formed beside the upper electrode 604. For example, the upper electrode 604 is formed by sputtering ITO (Indium Tin Oxide) serving as a light-transmitting electrically conductive film using a mask. The insulating layer 605 is formed by an application method using a room-temperature curable insulating resin. The insulating layer 605 is formed so that the upper electrode 604 is prevented from penetrating through the non-single crystalline silicon layer due to pressure of a measurement probe to contact the lower electrode 602 on characteristic measurement. After formation of the upper electrode 604 and the insulating layer 605, a highly electrically conductive electrode 606 is formed so as to cover a part of the upper electrode 604 and the insulating layer 605, as shown in FIG. 6C. For example, the highly electrically conductive electrode 606 made of aluminum is formed by vacuum evaporation using a mask. The highly electrically conductive electrode 606 is formed so as to reduce contact resistance with the measurement probe and to lower series resistance due to the upper electrode 604. After the highly electrically conductive electrode 606 is formed, solar battery portions 607a 607b and 607c contributing to electricity generation are completed as shown in FIG. 6C. As a method of measuring characteristics, as shown in FIG. 6D, measurement probes 608a, 608b and 608c are brought into contact with the highly electrically conductive electrode 606 connected to the upper electrode 604, while a measurement probe 609 is brought into contact with the lower electrode 602 to effectuate a measurement. It is preferable to use a measurement probe having a pointed end as the measurement probe 609 because the measurement probe 609 penetrates through the non-single crystalline silicon layer to be brought in contact with the lower electrode 602. Moreover, the solar battery portions 607a, 607b and 607c share the measurement probe 609 for measurement.

On the long-shaped flexible substrate, solar batteries are manufactured at each conveyed distance from the beginning of film formation. A voltage of −2 to −6 V is applied to the solar battery so as to measure its leak current characteristics. Then, in the characteristics described above, it is examined what percentage of solar batteries having poor characteristics due to short-circuiting between the upper electrode and the lower electrode are generated. In the solar batteries manufactured and whose films are formed in a plasma CVD device using a conventional shower plate type electrode, 50% of poor characteristics occurs at the location of 15 m from the beginning of film formation. In the solar batteries manufactured and whose films are formed in a plasma CVD device of the present invention, however, the occurrence of poor characteristics can be restricted to 5 to 20% even at the location of 300 m or more from the beginning of film formation.

Embodiment 2

Figure 8:
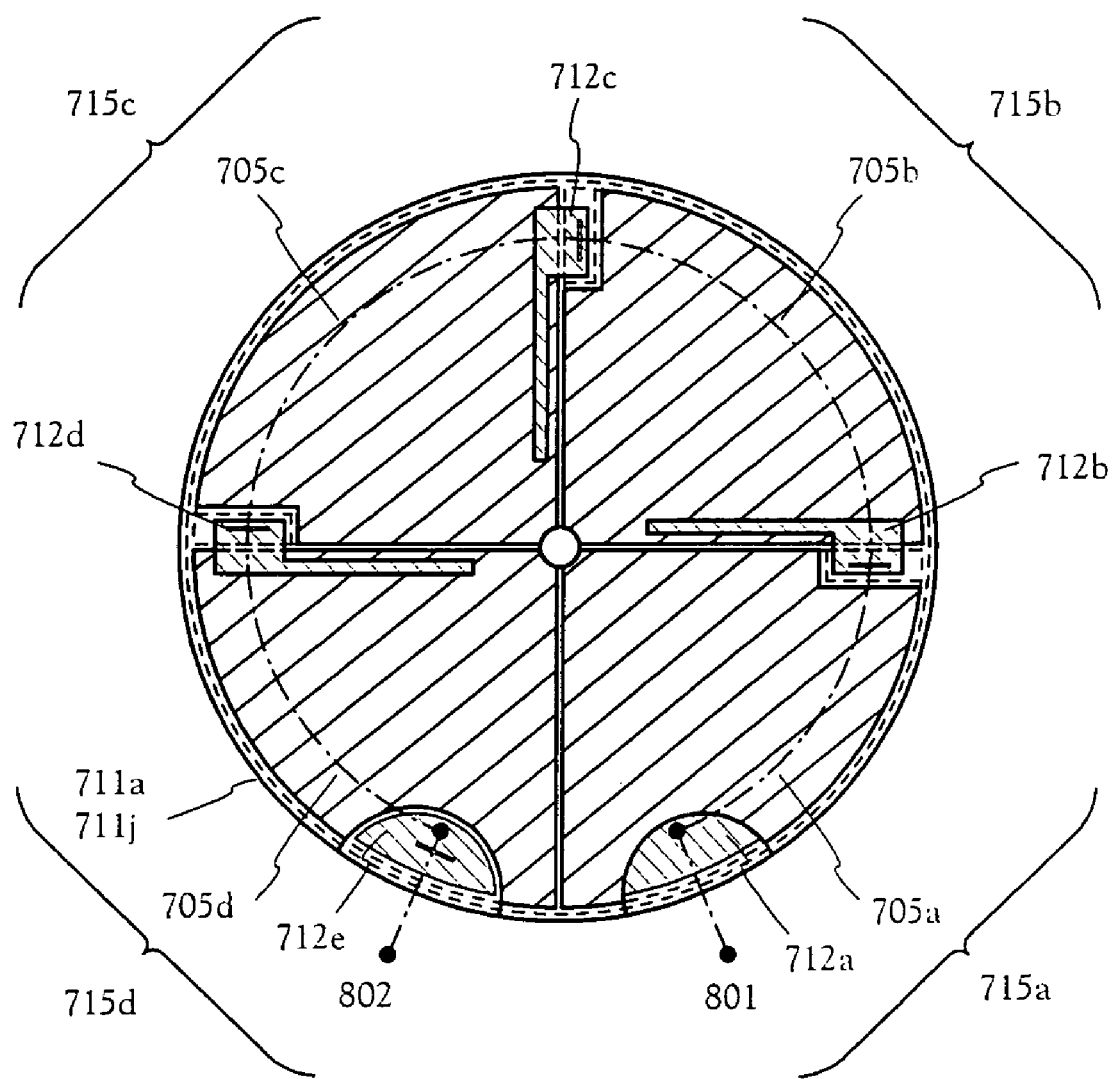
FIG. 8 is a plan view showing the solar battery manufactured according to product specifications of Embodiment 2.

In another embodiment of the present invention, a non-single crystalline silicon solar battery having a PIN structure is manufactured with an integrated structure. FIG. 8 is a plan view showing a solar battery, and FIGS. 7A to 7H shows the manufacturing process of the solar battery taken along a line 801 to 802 indicated with a dashed line in FIG. 8. First, in a similar manner as in Embodiment 1, a lower electrode 702 and a non-single crystalline silicon layer 703 are formed on a long-shaped flexible substrate 701 as shown in FIG. 7A, using the plasma CVD device as shown in FIG. 5. In this embodiment, a PEN (polyethylene naphthalate) film is used as the flexible substrate 701. The lower electrode 702 is formed to have a double-layered structure of aluminum having a thickness of 300 nm and SUS (stainless steel) having a thickness of 5 nm. In order to prevent an upper electrode and the lower electrode 702 from contacting each other by the manufacturing process of a solar battery, insulating layers 704a through 704j are formed. In this embodiment, the insulating layers 704a through 704j made of a thermosetting resin are formed by screen printing.

Next, as shown in FIG. 7B, an upper electrode 705 is formed. Thereafter, in order to protect a light-receiving surface of the solar battery from powdered particles generated upon laser patterning, protective layers 706a through 706d are formed. In this embodiment, the upper electrode 705 made of ITO is formed to have a thickness of 55 nm using a sputtering device. The protective layers 706a to 706d are formed of a thermosetting resin having light transmittance by screen printing. After formation of the protective layers 706a through 706d, the lower electrode layer 702, the non-single crystalline silicon layer 703 and the upper electrode layer 705 are divided into respective unit portions by using laser patterning so as to form units 715a to 715d of the solar battery. Divided pots 707a to 707d are formed by dividing the lower electrode layer 702 to the upper electrode layer 705 into respective units, whereas divided portions 708a to 708d are obtained by dividing only the upper electrode 705. Divided portions 709a 709b for forming the outer shape of the solar battery, and holes 710a and 710b through which electrodes for forming drawn electrodes of the solar battery on the lower side of the flexible substrate 701 penetrate, are simultaneously formed. The divided portions 707a to 707d, 708a to 708d, and 709a and 709b are filled with insulating resins 711a to 711j as shown in FIG. 7E. Then, wiring electrodes 712a to 712e are formed as shown in FIG. 7F. By filling the divided portions with the insulating resins, the tipper electrode and the lower electrode are prevented from contacting each other when the wiring electrodes are formed. In this embodiment, the insulating resin is formed of a thermosetting resin by screen printing. The wiring electrodes 712a through 712e are formed of an electrically conductive resin by screen printing. Furthermore, as shown in FIG. 7G, the upper electrode in one unit of the solar battery and the lower electrode in an adjacent unit are connected with each other so as to electrically connect the units in series by a laser bonding method. For example, in one unit 715b of the solar battery, the upper electrode 705b is connected to the lower electrode 702a of the adjacent unit 715a of the solar battery by the wiring electrode 712b and a laser bonding portion 713a. The lower electrode 702b is connected to the upper electrode 705c of the adjacent unit 715c on the side opposite to the unit 715a by a laser bonding portion 713c and the wiring electrode 712c. After connection in series, the end on the side of the upper electrode is drawn by the wiring electrode 712a and the end on the side of the lower electrode is drawn by the wiring electrode 712e beyond the lower side of the flexible substrate.

Finally, as shown in FIG. 7H, an upper electrode side drawn electrode 714a and a lower electrode side drawn electrode 714b are formed to complete a solar battery having an integrated structure in which four units of the solar battery are connected in series. In this embodiment, the drawn electrodes 714a and 714b are formed of an electrically conductive resin by screen printing. If characteristic defects due to fine particles and fragmental particles occur even in one unit of the solar battery, the output characteristics of the solar battery in which four units are connected in series are also lowered to reduce the characteristics and the yield of non-defective products. By using a plasma CVD device and a discharge electrode of the present invention, however, fine particles and fragmental particles are prevented from adhering onto a substrate on which a film is formed over a long length, thereby allowing the manufacture of a solar battery having good characteristics at a good yield.

A plasma CVD device of the present invention prevents particles such as fine particles generated by cohesion in a discharge space and fragmental particles generated by exfoliation of a film after formation of the film on a wall of a vacuum chamber or a discharge electrode from adhering onto a substrate on which a film is formed so as to allow continuous supply of electronic devices such as solar batteries having good characteristics at a good yield. Moreover, the present invention eliminates the need of cleaning the discharge electrode even if continuous discharge is performed over a long period of time, thereby improving the productivity in the plasma CVD device.

What is claimed is:

1. A plasma CVD apparatus comprising:
   a vacuum chamber;
   a first electrode for supplying an electric energy inside the vacuum chamber, the first electrode including a surface in which apertures are formed;
   a substrate support configured to support a substrate which opposes the surface of the first electrode, wherein the substrate support is configured to enable movement of the substrate in a first direction through the chamber; and
   first and second introducing ports for gas, located between the first electrode and the substrate, wherein the first and second introducing ports, the substrate support, and the first electrode are arranged relative to one another so that a first flow of gas is introduced by the first introducing port into the chamber in a direction parallel to and along the first direction, a second flow of gas is introduced by the second introducing port into the chamber in a direction parallel to and opposite to the first direction, and the first and second flows of gas are rectified in a direction away from a film formation surface of the substrate and toward the apertures so as to prevent particles with diameters greater than a thickness of a film to be formed on the substrate from being deposited on the film formation surface of the substrate;
   wherein the gas is exhausted through the apertures to the outside of the vacuum chamber.

2. The apparatus according to claim 1, further comprising:
   a transporting means for transporting continuously the substrate in the first direction.

3. The apparatus according to claim 2, wherein the transporting means includes at least one selected from the group consisting of an unwinding roll and a winding roll.

4. The apparatus according to claim 1, wherein each of the apertures is circular, and
   wherein the apertures are located on the surface of the first electrode at constant intervals.

5. The apparatus according to claim 1, wherein the first electrode is a mesh-like plate.

6. The apparatus according to claim 1 further comprising a second electrode opposing the first electrode for supplying the electric energy inside the vacuum chamber.

7. The apparatus according to claim 6, wherein the substrate is supported between the first and second electrodes by the substrate support.

8. The apparatus according to claim 1 wherein the substrate is located horizontally and has a substrate surface that is downwardly opposed to the first electrode.

9. The plasma CVD apparatus according to claim 1 further comprising an exhaust port and an abnormal discharge preventing plate between the exhaust port and the first electrode wherein the abnormal discharge preventing plate has a plurality of apertures.

10. An apparatus comprising:
    a chamber;
    a first electrode in the chamber;
    a second electrode in the chamber, the second electrode including a surface in which apertures are formed;
    a substrate support configured to support a substrate between the first and second electrodes wherein the substrate is moved in a first direction through the chamber;
    at least first and second gas inlet ports to introduce a gas to a space between the substrate and the second electrode wherein the first and second gas inlet ports, the substrate support, and the second electrode are arranged relative to one another so that a first flow of gas is introduced by the first gas inlet port in a direction parallel to and along the first direction, a second flow of gas is introduced by the second gas inlet port in a direction parallel to and opposite to the first direction, and the first and second flows of gas are rectified in a direction away from a film formation surface of the substrate and toward the apertures so as to prevent particles with diameters greater than a thickness of a film to be formed on the substrate from being deposited on the film formation surface of the substrate.

11. The apparatus according to claim 10 wherein the first electrode is grounded.

12. The apparatus according to claim 10 wherein the second electrode is located below the first electrode.

13. The apparatus according to claim 10 wherein the apparatus is a film formation apparatus.

14. The apparatus according to claim 10 wherein the gas inlet port is located in a position between the substrate and the second electrode.

15. The apparatus according to claim 10 further comprising an exhaust port and an abnormal discharge preventing plate between the second electrode and the exhaust port wherein the abnormal discharge preventing plate has a plurality of apertures.

16. The apparatus according to claim 10, further comprising a third electrode surrounding the space and the second electrode,
    wherein the third electrode has an opening, and
    wherein the gas is exhausted from the space through the apertures and the opening of the third electrode.

17. A plasma CVD apparatus comprising:
    a vacuum chamber;
    an exhaust port;
    a first electrode for supplying an electric energy inside the vacuum chamber, the first electrode including a surface in which apertures are formed;
    a substrate support configured to support a substrate which opposes the first electrode wherein the substrate is moved in a first direction through the chamber;
    first and second introducing ports for gas, located between the first electrode and the substrate, wherein the first and second introducing ports, the substrate support, and the first electrode are arranged relative to one another so that a first flow of gas is introduced by the first introducing port into the chamber in a direction parallel to and along the first direction, a second flow of gas is introduced by the second introducing port into the chamber in a direction parallel to and opposite to the first direction, and the first and second flows of gas are rectified in a direction away from a film formation surface of the substrate and toward the apertures so as to prevent particles with diameters greater than a thickness of a film to be formed on the substrate from being deposited on the film formation surface of the substrate; and an abnormal discharge preventing plate between the exhaust port and the first electrode wherein the abnormal discharge preventing plate has a plurality of apertures, wherein the gas is exhausted through the apertures of the first electrode and the plurality of apertures of the abnormal discharge preventing plate to the outside of the vacuum chamber.

18. The apparatus according to claim 17, further comprising a transporting means for transporting continuously the substrate in the first direction.

19. The apparatus according to claim 18, wherein the transporting means includes at least one selected from the group consisting of an unwinding roll and a winding roll.

20. The apparatus according to claim 17, wherein each of the apertures of the first electrode is circular, and
wherein the apertures are located on the surface of the first electrode at constant intervals.

21. The apparatus according to claim 17, wherein the first electrode is a mesh-like plate.

22. The apparatus according to claim 17, further comprising a second electrode opposing the first electrode for supplying the electric energy inside the vacuum chamber.

23. The apparatus according to claim 22, wherein the substrate is supported between the first and second electrodes by the substrate support.

24. The apparatus according to claim 17 wherein the substrate is located horizontally and has a substrate surface that is downwardly opposed to the first electrode.

25. An apparatus comprising:
a chamber;
a first electrode in the chamber;
a second electrode in the chamber, the second electrode including a surface in which apertures are formed;
a substrate support configured to support a substrate between the first and second electrodes wherein the substrate is moved in a first direction through the chamber;
at least first and second gas inlet ports to introduce a gas to a space between the substrate and the second electrode wherein the first and second gas inlet ports, the substrate support, and the second electrode are arranged relative to one another so that a first flow of gas is introduced by the first gas inlet port in a direction parallel to and along the first direction, a second flow of gas is introduced by the second gas inlet port in a direction parallel to and opposite to the first direction, and the first and second flows of gas are rectified in a direction away from a film formation surface of the substrate and toward the apertures so as to prevent particles with diameters greater than a thickness of a film to be formed on the substrate from being deposited on the film formation surface of the substrate; and an abnormal discharge preventing plate between the second electrode and an exhaust port
of the chamber wherein the abnormal discharge preventing plate has a plurality of apertures,
wherein the gas is exhausted through the plurality of apertures of the abnormal discharge preventing plate.

26. The apparatus according to claim 25 wherein the first electrode is grounded.

27. The apparatus according to claim 25 wherein the second electrode is located below the first electrode.

28. The apparatus according to claim 25 wherein the apparatus is a film formation apparatus.

29. The apparatus according to claim 25 wherein the gas inlet port is located in a position between the substrate and the second electrode.

30. The apparatus according to claim 25, further comprising a third electrode surrounding the space and the second electrode,
wherein the third electrode has an opening,
wherein the gas is exhausted from the space through the apertures of the second electrode, the plurality of apertures of the abnormal discharge preventing plate, and the opening of the third electrode.

* * * * *